(12) United States Patent
Song et al.

(10) Patent No.: US 10,290,353 B2
(45) Date of Patent: May 14, 2019

(54) ERROR MITIGATION FOR 3D NAND FLASH MEMORY

(71) Applicant: Western Digital Technologies, Inc., Irvine, CA (US)

(72) Inventors: Seung-Hwan Song, San Jose, CA (US); Viacheslav Anatolyevich Dubeyko, San Jose, CA (US); Zvonimir Z. Bandic, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 7 days.

(21) Appl. No.: 15/257,598

(22) Filed: Sep. 6, 2016

(65) Prior Publication Data
US 2018/0068726 A1    Mar. 8, 2018

(51) Int. Cl.
| | | |
|---|---|---|
| *G11C 29/00* | (2006.01) | |
| *G11C 16/10* | (2006.01) | |
| *G06F 11/10* | (2006.01) | |
| *G11C 16/16* | (2006.01) | |
| *G11C 16/26* | (2006.01) | |

(Continued)

(52) U.S. Cl.
CPC .......... *G11C 16/10* (2013.01); *G06F 11/1068* (2013.01); *G11C 7/14* (2013.01); *G11C 11/5628* (2013.01); *G11C 11/5642* (2013.01); *G11C 16/16* (2013.01); *G11C 16/26* (2013.01); *G11C 16/3427* (2013.01); *G11C 29/52* (2013.01);

(Continued)

(58) Field of Classification Search
None
See application file for complete search history.

(56) References Cited

U.S. PATENT DOCUMENTS

| | | |
|---|---|---|
| 5,765,185 A | 6/1998 | Lambrache et al. |
| 8,264,880 B1 | 9/2012 | Yang |

(Continued)

FOREIGN PATENT DOCUMENTS

CN    103984509 A    8/2014

OTHER PUBLICATIONS

Luo et al., "WARM: Improving NAND Flash Memory Lifetime with Write-hotness Aware Retention Management", 2015 IEEE, 14 pgs. (Applicant points out, in accordance with MPEP 609.04(a), that the year of publication, 2015, is sufficiently earlier than the effective U.S. filing date, Sep. 6, 2016, so that the particular month of publication is not in issue.).

*Primary Examiner* — Mujtaba M Chaudry
(74) *Attorney, Agent, or Firm* — Foley & Lardner LLP

(57) ABSTRACT

NAND cell error remediation technologies are disclosed. The remediation technologies are applicable to 3D NAND. In one example, a storage device may include a processor and a memory device comprising NAND flash memory. The processor is configured to detect an error condition associated with a first page of the NAND flash memory, and determine whether the error condition is associated with a read disturbance or with a retention error. The processor is configured to initiate, if the error condition is associated with the read disturbance, a refresh operation with respect to the page to write data stored at the first page to a second page of the NAND flash memory, and initiate, if the error condition is associated with the retention error, a reprogramming operation with respect to the page to rewrite the data stored at the first page to the first page of the NAND flash memory.

20 Claims, 8 Drawing Sheets

(51) Int. Cl.
*G11C 16/34* (2006.01)
*G11C 29/52* (2006.01)
*H03M 13/29* (2006.01)
*G11C 7/14* (2006.01)
*G11C 11/56* (2006.01)
*G11C 29/04* (2006.01)

(52) U.S. Cl.
CPC . *H03M 13/2906* (2013.01); *G11C 2029/0411* (2013.01)

(56) References Cited

U.S. PATENT DOCUMENTS

| | | | |
|---|---|---|---|
| 8,930,778 | B2 | 1/2015 | Cohen |
| 8,942,028 | B1 | 1/2015 | Hu |
| 9,043,678 | B2 | 5/2015 | Jeon et al. |
| 9,123,422 | B2 | 9/2015 | Yu et al. |
| 9,524,790 | B1* | 12/2016 | Steiner ............... G11C 11/5642 |
| 2004/0257888 | A1* | 12/2004 | Noguchi ............. G06F 11/1008 365/200 |
| 2011/0075484 | A1* | 3/2011 | Lee ................... G11C 16/0408 365/185.17 |
| 2012/0221773 | A1* | 8/2012 | Shuto ................. G06F 11/1068 711/103 |
| 2012/0290899 | A1* | 11/2012 | Cideciyan ........... G06F 11/1072 714/773 |
| 2013/0275651 | A1* | 10/2013 | D'Abreu ............. G11C 11/5628 711/103 |
| 2015/0332772 | A1* | 11/2015 | Kim ................... G11C 16/32 365/185.22 |
| 2016/0034352 | A1* | 2/2016 | Michael .............. G06F 11/1072 714/773 |
| 2016/0110124 | A1* | 4/2016 | Camp .................. G06F 3/0619 714/704 |
| 2016/0342494 | A1* | 11/2016 | Yang .................. G11C 16/3404 |
| 2017/0070241 | A1* | 3/2017 | Kaku .................. H03M 13/2906 |
| 2017/0123694 | A1* | 5/2017 | Miomo ................ G06F 3/0659 |
| 2017/0132125 | A1* | 5/2017 | Cai ..................... G06F 3/061 |
| 2017/0358365 | A1* | 12/2017 | Ray .................... G11C 16/0483 |

\* cited by examiner

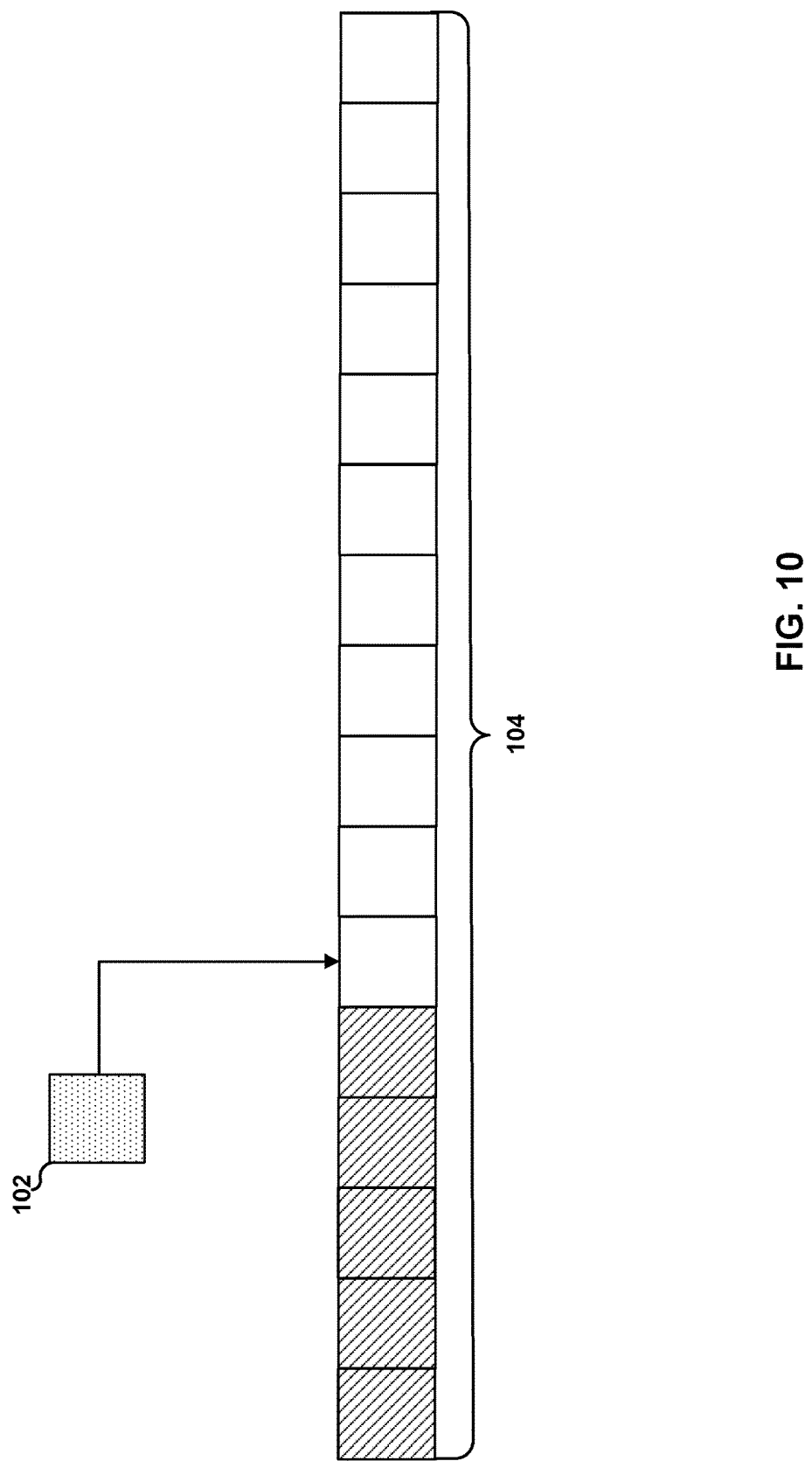

ERROR MITIGATION FOR 3D NAND FLASH MEMORY

TECHNICAL FIELD

This disclosure generally relates to systems and mechanisms for reprogramming and/or refreshing flash memory cells.

BACKGROUND

Storage devices used in computers or other electronics devices may include one or both of non-volatile memory or volatile memory. Non-volatile memory enables data storage in cases of power loss, whether the power loss is planned or unplanned. As a result, non-volatile memory devices have developed into a popular type of memory for a wide range of electronic applications. For instance, non-volatile memory devices, including flash memory devices, are commonly incorporated into solid-state storage devices, such as solid-state drives (SSDs). Due to retention limits associated with flash memory cells, flash memory devices are configured to refresh the cells upon the stored data becoming "cold." Refreshing a flash memory cell involves reading the cold data from a location (e.g., a page), decoding the data using an error-correcting code (ECC), encoding the data, and programming the data to a new location (e.g., to a new page).

SUMMARY

This disclosure is generally directed to systems and techniques for updating data stored by flash memory cells. Some aspects of this disclosure are directed to a selective updating data stored by flash memory cells, such as by refreshing or reprogramming particular cells that have reached or are nearing a predetermined error-correcting code (ECC) limit. A flash memory cell (or, more accurately, data associated with the flash memory cell) may be refreshed by reading the data from the flash memory cell and writing the data to a different flash memory cell. In some examples of the selective updating techniques of this disclosure, flash memory cells that exhibit a read disturbance error (charge injection into the floating gate due to reads of adjacent flash memory cells) are refreshed instead of being reprogrammed. According to aspects of this disclosure, the read-disturbed cells may be refreshed in a batch-processed manner, such as by refreshing an entire block even if only a subset of the pages are read-disturbed. In contrast, in some examples, a flash memory cell that exhibits a retention error (charge depletion from the floating gate due to leakage) may be reprogrammed. A flash memory cell may be reprogrammed by reading data from the flash memory cell and writing the data to the same flash memory cell.

In some examples, the disclosure describes a method including detecting, by one or more processors, an error condition associated with a first page of NAND flash memory, and determining, by the one or more processors, whether the error condition is associated with a read disturbance or with a retention error. The method may further include, if the error condition is associated with the read disturbance, initiating, by the one or more processors, a refresh operation with respect to the page to write data stored at the first page to a second page of the NAND flash memory, and if the error condition is associated with the retention error, initiating, by the one or more processors, a reprogramming operation with respect to the page to rewrite the data stored at the first page to the first page.

In some examples, the disclosure describes a storage device that includes at least one processor and at least one memory device comprising NAND flash memory. The processor may be configured to detect an error condition associated with a first page of the NAND flash memory, and determine whether the error condition is associated with a read disturbance or with a retention error. The processors may further be configured to initiate, if the error condition is associated with the read disturbance, a refresh operation with respect to the page to write data stored at the first page to a second page of the NAND flash memory, and initiate, if the error condition is associated with the retention error, a reprogramming operation with respect to the page to rewrite the data stored at the first page to the first page of the NAND flash memory.

In some examples, the disclosure describes a computer-readable storage medium that stores instructions that, when executed, cause at least one processor of a computing device to detect an error condition associated with a first page of NAND flash memory, and to determine whether the error condition is associated with a read disturbance or with a retention error. The instructions, when executed, may further cause the at least one processor of the computing device to initiate, if the error condition is associated with the read disturbance, a refresh operation with respect to the page to write data stored at the first page to a second page, and to initiate, if the error condition is associated with the retention error, a reprogramming operation with respect to the page to rewrite the data stored at the first page to the first page.

In some examples, the disclosure describes an apparatus. The apparatus may include means for detecting an error condition associated with a first page of NAND flash memory, and means for determining whether the error condition is associated with a read disturbance or with a retention error. The apparatus may further include means for initiating, if the error condition is associated with the read disturbance, a refresh operation with respect to the page to write data stored at the first page to a second page, and means for initiating, if the error condition is associated with the retention error, a reprogramming operation with respect to the page to rewrite the data stored at the first page to the first page.

The systems and techniques of this disclosure may provide one or more advantages. For instance, the selective reprogramming techniques of this disclosure may mitigate garbage collection and the resulting resource consumption. Additionally, the selective reprogramming techniques of this disclosure may eliminate the need to perform reprogramming in certain scenarios, thereby conserving resources. Additionally, the batch-processing refresh techniques of this disclosure may reduce the time and resource consumption that would otherwise be expended for erase operations.

The details of one or more examples are set forth in the accompanying drawings and the description below. Other features, objects, and advantages will be apparent from the description and drawings, and from the claims.

BRIEF DESCRIPTION OF DRAWINGS

FIG. 10 is a conceptual diagram illustrating the operation of a refresh queue by a controller, in accordance with aspects of this disclosure.

DETAILED DESCRIPTION

In general, this disclosure describes systems and techniques for improved updating of data stored by NAND flash memory cells. Some aspects of this disclosure are directed to selective updating mechanisms. According to the selective updating mechanisms of this disclosure, a controller of a storage device may identify specific pages of flash memory that are candidates for updating, such as by determining whether or not particular pages are approaching the ECC limit. In turn, the controller may implement the selective updating technologies of this disclosure to reprogram or refresh those pages that are approaching (e.g., are within a threshold time from) the ECC limit, while avoiding reprogramming or refreshing the other pages. Pages approaching the ECC limit may also be referred to herein as "error pages" due to either a "retention error" or some other type of error. A retention error may occur in cases of electron leakage from the floating gate (or the charge traps) of a cell, which results in a drop in the cell threshold voltage. Reprogramming a cell entails reading the data stored to the cell, decoding the data, re-encoding the data, and rewriting the re-encoded data to the same cell by restoring the cell threshold voltage on the floating gate (e.g., by injecting electrons into the floating gate).

According to some implementations of the systems described herein, the controller may reprogram pages with a retention error, as described above, and may also refresh certain other pages. For instance, in addition to reprogramming the pages with a retention error, the controller may refresh one or more pages that are associated with a "read disturbance" error. A read disturbance error may arise from charge injection along the word line of a cell, resulting in an increase in the cell threshold voltage of the floating gate of the cell. Refreshing an error-affected cell entails reading the data of the cell, decoding the data, re-encoding the data, and rewriting the re-encoded data to a new location (e.g., a new page), after adding an entire block that includes the error-affected cell to a refresh queue in which a block at the head of the queue is the candidate for the next refresh operation. In some examples, the controller may refresh an entire block of pages if the controller determines that a subset of the pages of the block exhibit read disturbance errors. In this way, the controller may batch-process the page refreshes to conserve time and resources associated with the erase operations involved in refreshing the read-disturbed pages. According to various implementations of the techniques described herein, the controller may implement the reprogramming operations in a random order. In some implementations of the techniques described herein, the controller may implement the refresh operations in a queued manner, such as by refreshing a block containing page data that has read disturbance errors in a first-in-first-out (FIFO) manner.

Figure 1:
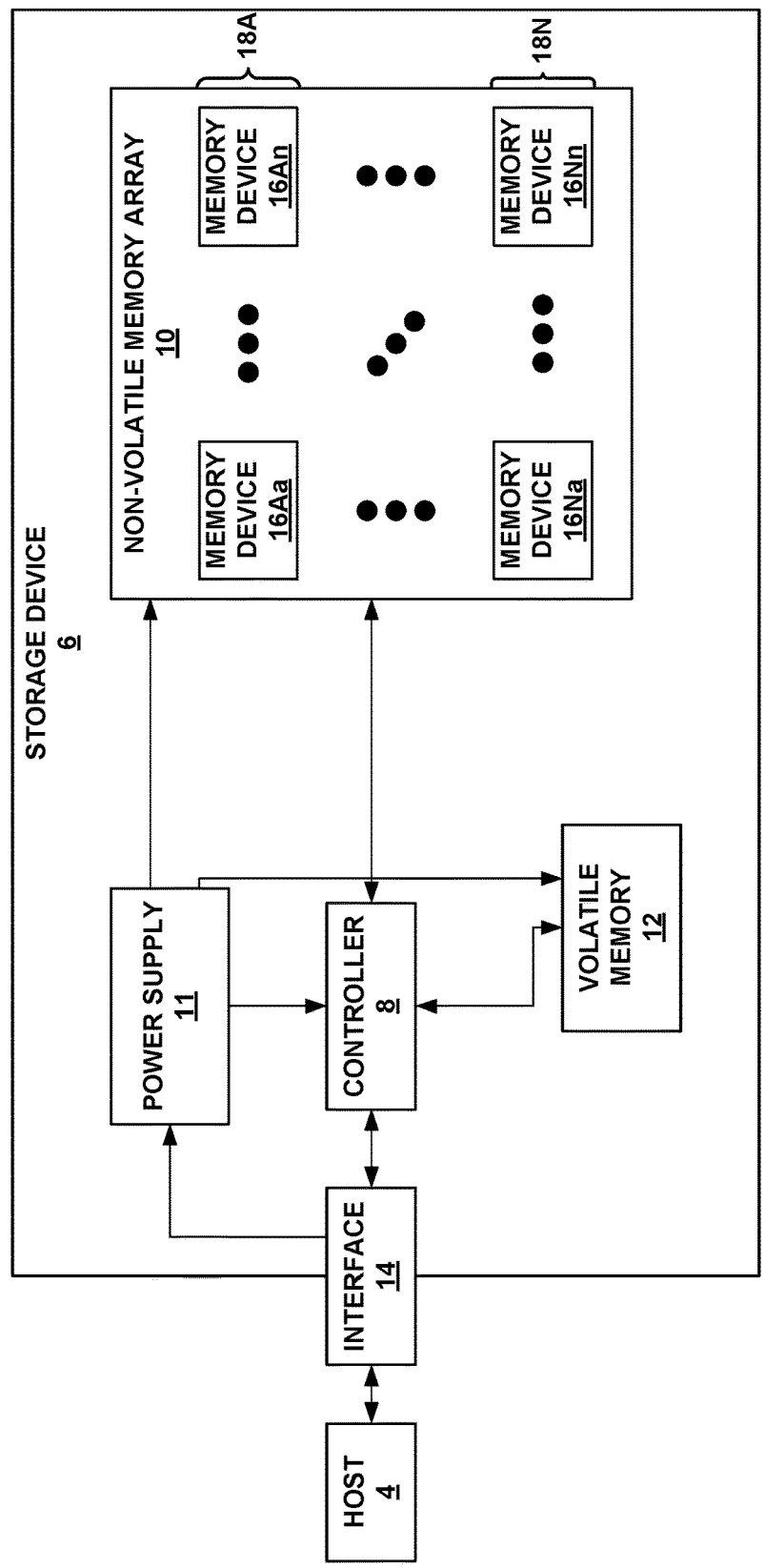
FIG. 1 is a conceptual and schematic block diagram illustrating an example storage environment in which a storage device may function as a storage device for a host device, in accordance with one or more techniques of this disclosure.

FIG. 1 is a conceptual and schematic block diagram illustrating an example storage environment 2 in which storage device 6 may function as a storage device for host device 4, in accordance with one or more techniques of this disclosure. For instance, host device 4 may utilize non-volatile memory devices included in storage device 6 to store and retrieve data. In some examples, storage environment 2 may include a plurality of storage devices, such as storage device 6, that may operate as a storage array. For instance, storage environment 2 may include a plurality of storages devices 6 configured as a redundant array of inexpensive/independent disks (RAID) that collectively function as a mass storage device for host device 4.

Storage environment 2 may include host device 4 which may store and/or retrieve data to and/or from one or more storage devices, such as storage device 6. As illustrated in FIG. 1, host device 4 may communicate with storage device 6 via interface 14. Host device 4 may comprise any of a wide range of devices, including computer servers, network attached storage (NAS) units, desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, and the like. Host device 4 may identify data stored in storage environment 2 using logical or virtual addresses.

As illustrated in FIG. 1 storage device 6 may include controller 8, non-volatile memory array 10 (NVMA 10), power supply 11, volatile memory 12, and interface 14. In some examples, storage device 6 may include additional components not shown in FIG. 1 for sake of clarity. For example, storage device 6 may include a printed board (PB) to which components of storage device 6 are mechanically attached and which includes electrically conductive traces that electrically interconnect components of storage device 6; and the like. In some examples, the physical dimensions and connector configurations of storage device 6 may conform to one or more standard form factors. Some example standard form factors include, but are not limited to, 3.5" hard disk drive (HDD), 2.5" HDD, 1.8" HDD, peripheral component interconnect (PCI), PCI-extended (PCI-X), PCI Express (PCIe) (e.g., PCIe x1, x4, x8, x16, PCIe Mini Card, MiniPCI, etc.). In some examples, storage device 6 may be directly coupled (e.g., directly soldered) to a motherboard of host device 4.

Storage device 6 may include interface 14 for interfacing with host device 4. Interface 14 may include one or both of a data bus for exchanging data with host device 4 and a control bus for exchanging commands with host device 4. Interface 14 may operate in accordance with any suitable protocol. For example, interface 14 may operate in accordance with one or more of the following protocols: advanced technology attachment (ATA) (e.g., serial-ATA (SATA) and parallel-ATA (PATA)), Fibre Channel, small computer system interface (SCSI), serially attached SCSI (SAS), peripheral component interconnect (PCI), PCI-express, or Non-Volatile Memory Express (NVMe). The electrical connection of interface 14 (e.g., the data bus, the control bus, or both) is electrically connected to controller 8, providing electrical connection between host device 4 and controller 8, allowing data to be exchanged between host device 4 and controller 8. In some examples, the electrical connection of interface 14 may also permit storage device 6 to receive power from host device 4. For example, as illustrated in FIG. 1, power supply 11 may receive power from host device 4 via interface 14.

Storage device 6 includes controller 8, which may manage one or more operations of storage device 6. For instance, controller 8 may manage the reading of data from and/or the writing of data to memory devices 16Aa-16Nn (collectively, "memory devices 16"). In some examples, although not illustrates in FIG. 1, storage device 6 also may include a read channel, a write channel, or both, which may further manage one or more operations of storage device 6. For example, the read channel may, as one example, manage reads from memory devices 16, and the write channel may, as one example, manage writes to memory devices 16. In some examples, read channel may perform techniques of this disclosure, such as determining a values of respective bits stored by memory cells of memory devices 16.

Storage device 6 may include NVMA 10, which may include a plurality of memory devices 16. Each of memory devices 16 may be configured to store and/or retrieve data. For instance, a memory device of memory devices 16 may receive data and a message from controller 8 that instructs the memory device to store the data. Similarly, the memory device of memory devices 16 may receive a message from controller 8 that instructs the memory device to retrieve data. In some examples, each of memory devices 16 may be referred to as a die. In some examples, a single physical chip may include a plurality of dies (i.e., a plurality of memory devices 16). In some examples, each of memory devices 16 may be configured to store relatively large amounts of data (e.g., 128 MB, 256 MB, 512 MB, 1 GB, 2 GB, 4 GB, 8 GB, 16 GB, 32 GB, 64 GB, 128 GB, 256 GB, 512 GB, 1 TB, etc.).

In some examples, memory devices 16 may include any type of non-volatile memory devices. Some examples, of memory devices 16 include, but are not limited to flash memory devices, phase-change memory (PCM) devices, resistive random-access memory (ReRAM) devices, magnetoresistive random-access memory (MRAM) devices, ferroelectric random-access memory (F-RAM), holographic memory devices, and any other type of non-volatile memory devices.

Figure 2:
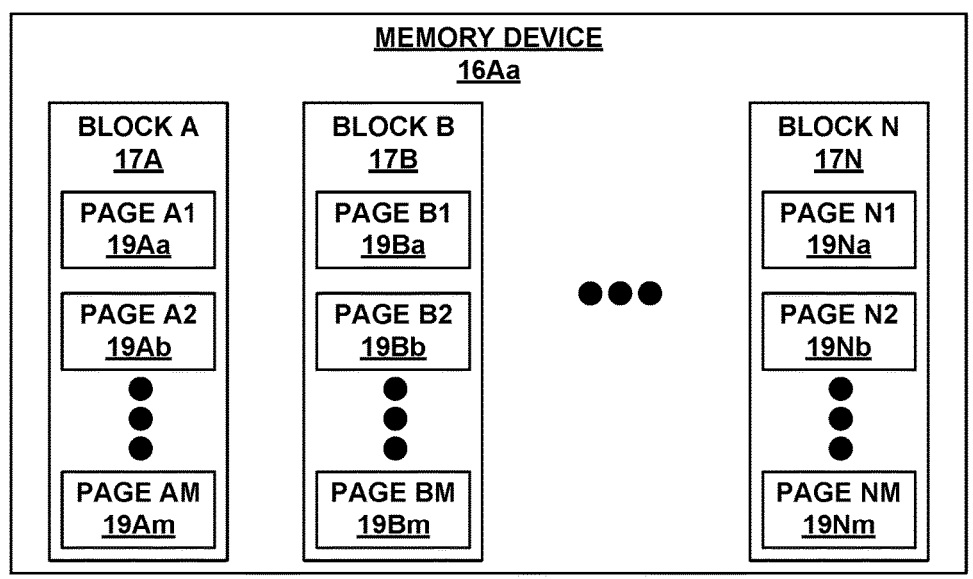
FIG. 2 is a conceptual diagram illustrating an example memory device, in accordance with one or more techniques of this disclosure.

Flash memory devices may include NAND based flash memory devices, and may store data based on a charge contained in a floating gate (or charge traps in the tunnel oxide) of a transistor for each flash memory cell. In NAND flash memory devices, the flash memory device may be divided into a plurality of blocks, each of which may be divided into a plurality of pages. FIG. 2 is a conceptual block diagram illustrating an example memory device 16Aa, which includes a plurality of blocks 17A-17N (collectively, "blocks 17"), each of which is divided into a plurality of pages 19Aa-19Nm (collectively, "pages 19"). Each page of the pages 19 within a particular memory device (e.g., memory device 16Aa) may include a plurality of flash memory cells. In NAND flash memory devices, rows of flash memory cells may be electrically connected using a word line to define a page of the plurality of pages 19. Respective cells in each of the pages 19 may be electrically connected to respective bit lines. Controller 8 may write data to and read data from NAND flash memory devices at the page level and erase data from NAND flash memory devices at the block level.

In some examples, rather than each flash memory cell storing a single bit of data, each flash memory cell may include multiple bits of data. For example, flash memory cells of memory devices 16 may include MLC flash memory cells, TLC flash memory cells, or the like. In some examples, each bit in a MLC flash memory cell or a TLC flash memory cell is associated with a respective page of pages 19. For example, a first bit stored by a MLC flash memory cell may be associated with an upper page and a second bit stored by a MLC flash memory cell may be associated with a lower page. Similarly, a first bit stored by a TLC flash memory cell may be associated with an upper page, a second bit stored by a TLC flash memory cell may be associated with a middle page, and a third bit stored by a TLC flash memory cell may be associated with a lower page. Similarly, respective bits of MLC and TLC flash memory cells may be associated with respective physical page addresses, as described in more detail below.

The memory cells of pages 19 may include three-dimensional (3D) NAND (or "3D NAND") cells. 3D NAND cells differ from 2D planar NAND cells, in that 3D NAND cells enable vertical stacking of cell strings. In turn, the vertically-stacked cell strings can be positioned in rows and columns, thereby providing a three-dimensional array of cells. 3D NAND offers various enhancements over 2D planar NAND. By vertically layering cells and positioning the vertical stacks in a two-dimensional array, 3D NAND technology increases the storage capacity of a memory device such as memory device 16Aa of FIG. 2. 3D NAND technology also offers additional enhancements over 2D planar NAND technology, such as increased speed for read/write operations, longer endurance of the NAND cells, and more efficient power usage. Moreover, 3D NAND technology may mitigate interference-related issues that arise from cell density. For instance, attempts to compress the inter-cell space in a 2D planar scheme may cause signal interference and/or electron leakage along a word line. However, in a 3D NAND scheme, the relaxed inter-cell distance with the surrounded gate structure may cause much less interference between cells, as vertical stacking allows for an increased cell count, without the need to compress the inter-cell spacing. Thus, 3D NAND technology has yielded improved writing speed as compared to 2D planar NAND technology by adapting single-pass programming scheme. For example, upper and lower pages are programmed together in 3D MLC NAND technology, whereas the upper page is programmed first and the lower page is programmed later after affected by interference from adjacent cells in 2D MLC NAND.

In some examples, it may not be practical for controller 8 to be separately connected to each memory device of memory devices 16. As such, the connections between memory devices 16 and controller 8 may be multiplexed. As an example, memory devices 16 may be grouped into channels 18A-18N (collectively, "channels 18"). For instance, as illustrated in FIG. 1, memory devices 16Aa-16An may be grouped into first channel 18A, and memory devices 16Na-16Nn may be grouped into $N^{th}$ channel 18N. The memory devices 16 grouped into each of channels 18 may share one or more connections to controller 8. For instance, the memory devices 16 grouped into first channel 18A may be attached to a common I/O bus and a common control bus. Storage device 6 may include a common I/O bus and a common control bus for each respective channel of channels 18. In some examples, each channel of channels 18 may include a set of chip enable (CE) lines which may be used to multiplex memory devices on each channel. For example, each CE line may be connected to a respective memory device of memory devices 16. In this way, the number of separate connections between controller 8 and memory devices 16 may be reduced. Additionally, as each channel has an independent set of connections to controller 8, the reduction in connections may not significantly affect the data throughput rate as controller 8 may simultaneously issue different commands to each channel.

Storage device 6 may include power supply 11, which may provide power to one or more components of storage device 6. When operating in a standard mode, power supply 11 may provide power to the one or more components using power provided by an external device, such as host device 4. For instance, power supply 11 may provide power to the one or more components using power received from host device 4 via interface 14. In some examples, power supply 11 may include one or more power storage components configured to provide power to the one or more components when operating in a shutdown mode, such as where power ceases to be received from the external device. In this way, power supply 11 may function as an onboard backup power source. Some examples of the one or more power storage components include, but are not limited to, capacitors, super capacitors, batteries, and the like. In some examples, the amount of power that may be stored by the one or more power storage components may be a function of the cost and/or the size (e.g., area/volume) of the one or more power storage components. In other words, as the amount of power stored by the one or more power storage components increases, the cost and/or the size of the one or more power storage components also increases.

Storage device 6 may include volatile memory 12, which may be used by controller 8 to store information. In some examples, controller 8 may use volatile memory 12 as a cache. For instance, controller 8 may store cached information 13 in volatile memory 12 until cached information 13 is written to memory devices 16. As illustrated in FIG. 1, volatile memory 12 may consume power received from power supply 11. Examples of volatile memory 12 include, but are not limited to, random-access memory (RAM), dynamic random access memory (DRAM), static RAM (SRAM), and synchronous dynamic RAM (SDRAM (e.g., DDR1, DDR2, DDR3, DDR3L, LPDDR3, DDR4, and the like).

In some examples, controller 8 may use volatile memory 12 to store a logical-to-physical ("L2P" or virtual-to-physical) data address translation table. Host device 4 may refer to a unit of data using the logical data address, and controller 8 may utilize physical data addresses to direct writing of data to and reading of data from memory devices 16. In some examples, the logical to physical data address translation table may include entries that include a logical data address and a corresponding physical data address. In some examples, rather than each entry in the logical-to-physical data address translation table including a logical data address, the logical-to-physical data address translation table may include an index that encodes the respective logical data address of each entry in the logical to physical data address translation table. In some of these examples, the logical to physical data address translation table may not store the index value (or logical data address) with the respective entries in the logical to physical data address translation table.

Controller 8 may use the same single-pass programming command with respect to reprogramming the cells of memory device 16Aa, because 3D NAND cells are compatible with single-pass programming. For instance, controller 8 may use a "program" command that is compatible with 2D planar NAND cells in order to reprogram 3D NAND cells. To reprogram 3D NAND cells using a single-pass programming scheme, controller 8 may program all states in a single step without disturbing adjacent cells, due to a low amount of coupling between adjacent word lines.

To retain data that could otherwise be lost due to errors, controller 8 may update 3D NAND cells of memory device 16Aa from time to time. For instance, each cell of memory device 16Aa may have a retention limit, may be affected by read operations for adjacent cells, or both. The retention limit refers to a period of time after which stale data or "cold" data stored to the cell is potentially lost due to hardware limitations, such as charge leakage from the floating gate of the cell.

Moreover, controller 8 may reprogram the cells of memory device 16Aa using an in-place reprogramming command. 3D NAND technology supports in-place reprogramming, which is described in further detail below. Reprogramming generally involves three steps, namely, a read operation, an ECC decoding/encoding operation, and a program operation. In the read operation, controller 8 may read the data that is currently stored to a page 19 of one of blocks 17. Based on a determination that the data of the respective page 19 have reached or are nearing the retention limit, controller 8 may decode the read data using an ECC associated with the data, and then encode the data using a pertinent ECC. In the third step, controller 8 may program the ECC encoded data to the same page 19 from which the original data was read. Because the data is programmed to the same page of pages 19 from which the then-cold data was read, this reprogramming technique is referred to as "in-place" reprogramming.

In-place reprogramming of a cell involves a number of operations. The first operation is to read the currently-stored data from the cell. For instance, controller 8 may read the data and copy the data to a temporary or "temp" location. Controller 8 may perform the remaining steps in various orders or sequences. As another step in the in-place reprogramming process, controller 8 may decode and re-encode the copied data using ECC. As a final step of the in-place reprogramming process, controller 8 may program the ECC-encoded data back into the same location (e.g., page) from where controller 8 originally read the data. As another step of the in-place reprogramming process, memory device 16 may reconfigure the cell threshold voltage. For instance, memory device 16 may program the cell to restore the cell to the originally-assigned state. Because reprogramming involves programming a cell to restore the cell to its originally-programmed state, controller 8 may use reprogramming in instances in which the cell threshold voltage has dropped (e.g., due to electron leakage from the floating gate).

According to some implementations of the techniques described herein, controller 8 may leverage 3D NAND technology to reprogram pages in any order. The structure of 3D NAND arrays reduces the coupling between adjacent cells, in comparison to 2D planar NAND technology. Because of the diminished coupling between adjacent cells in 3D NAND technology, controller 8 may reprogram the pages in any order, as back-pattern dependency between the cells may be reduced or even negligible. In one example, controller 8 may use the ability to reprogram pages in any order to reprogram only the error-prone pages within entire blocks.

Data refresh techniques for NAND cells utilize a similar process to reprogramming, but with some differences. For example, to implement a refresh process, controller 8 may write the ECC re-encoded data to a different location (e.g., a different page). Because the refresh process uses a new location for storing the copied data, the refresh operation increases wear, and triggers an increase in garbage collection. Thus, reprogramming cells rather than refreshing data associated with a cell to a new location may be preferred to lower wear and garbage collection operations.

In the context of 2D planar NAND cells, reprogramming commands were unavailable. Thus, 2D NAND technology was limited to refresh operations, regardless of whether the error in the NAND cell was a retention error or a read disturbance error. 3D NAND technology supports in-place reprogramming commands and refresh commands. Thus, controller 8 may leverage both refresh as well as in-place reprogramming processes to implement one or more techniques of this disclosure.

In accordance with one or more aspects of this disclosure, controller 8 may be configured to select between refresh and in-place reprogramming, based on a particular type of error that controller 8 encounters with respect to a NAND cell. For instance, controller 8 may implement the reprogram process to remediate a retention error, and may refresh a cell to remediate a read disturb error. Read disturb errors refer to instances in which a cell is subject to so-called "charge injection." For instance, a cell may be subject to charge injection in the cells from the unselected word lines during a read process of the selected cells, since high voltages are applied to the word line of the unselected cell for conducting string current.

Upon charge injection, the cell threshold voltage increases, because of the increased level of charge in the floating gate of the cell. A read disturb error can be rectified using refreshing the data associated with the cell to a new cell. For instance, controller 8 may leverage a program command that is compatible with 2D planar NAND technology to perform refreshing of 3D NAND cells.

In accordance with the aspects of this disclosure, controller 8 may be configured to reprogram cells that are subject to a retention error. Retention errors refer to changes, namely, drops, in cell threshold voltages over time. More specifically, retention errors arise from electron leakage from the floating gate of a cell. As the floating gate leaks or loses electrons, the read voltage of the cell may drop. In other words, retention errors may be manifested by a decrease in cell threshold voltage, due to the loss of electrons from the floating gate of the cell. Thus, if a stored data of the cell becomes stale or cold, then the data is at risk of being lost, due to the ongoing electron leakage from the floating gate of the cell.

Retention errors can be remediated via a reprogram operation. As discussed above, reprogramming a cell involves injecting electrons into the floating gate of the cell. Because retention errors are associated with electron loss, controller 8 may remediate a retention error by injecting electrons (i.e., reprogramming) into a floating gate of a cell for which controller 8 detects a retention error. In one example, controller 8 may determine that a cell is within a threshold time of reaching the retention limit of the cell. In other words, in this example, controller 8 may determine that the cell is nearing or approaching the retention limit of the cell. Based on the determination that the cell is nearing its retention limit, controller 8 may avoid potential data loss by performing a reprogram process on the cell. In some examples, the reprogram process is an in-place reprogram process, e.g., the data is programmed to the same cell at which it was originally stored.

In this way, controller 8 may implement the techniques of this disclosure to avoid and/or remediate both read disturb errors and retention errors by dynamically selecting and implementing processes that better suit each individual type of error. Said another way, controller 8 may implement the techniques of this disclosure to selectively refresh or reprogram 3D NAND cells of memory device 16Aa, based on the nature of the error that controller 8 detects with respect to a particular cell.

By implementing the techniques of this disclosure, controller 8 may provide one or more advantages over existing error-remediation techniques. For instance, controller 8 may conserve computing resources in instances where controller 8 reprograms a cell, because the reprogramming process is less resource-heavy than refreshing. Additionally, by using in-place reprogramming with respect to retention error cells, controller 8 may reduce the garbage collection resource consumption as compared to devices in which any updating requires moving the data to a new location. Thus, according to the techniques of this disclosure, controller 8 selectively implements both refresh and reprogramming processes as applicable, to provide resource consumption benefits while maintaining data accuracy.

As used herein, a "read disturbed page" refers to a page for which controller 8 has detected a read disturb error or a read disturbance. As used herein, a "retention error page" refers to a page that controller 8 has determined is at or nearing its retention limit. Controller 8 may implement one or more techniques of this disclosure to identify and distinguish between read disturbed pages and retention error pages. For instance, controller 8 may program certain cells (referred to as "dummy cells") of a page with predetermined patterns. According to these examples, controller 8 may manipulate the dummy cell pattern in one way to detect retention error cells, and may manipulate the dummy cell pattern in another way to detect read disturbed cells. In turn, controller 8 may reprogram any pages that are detected to be associated with a retention error pattern, and may refresh any pages that are detected to be associated with a read disturbance pattern.

Figure 3:
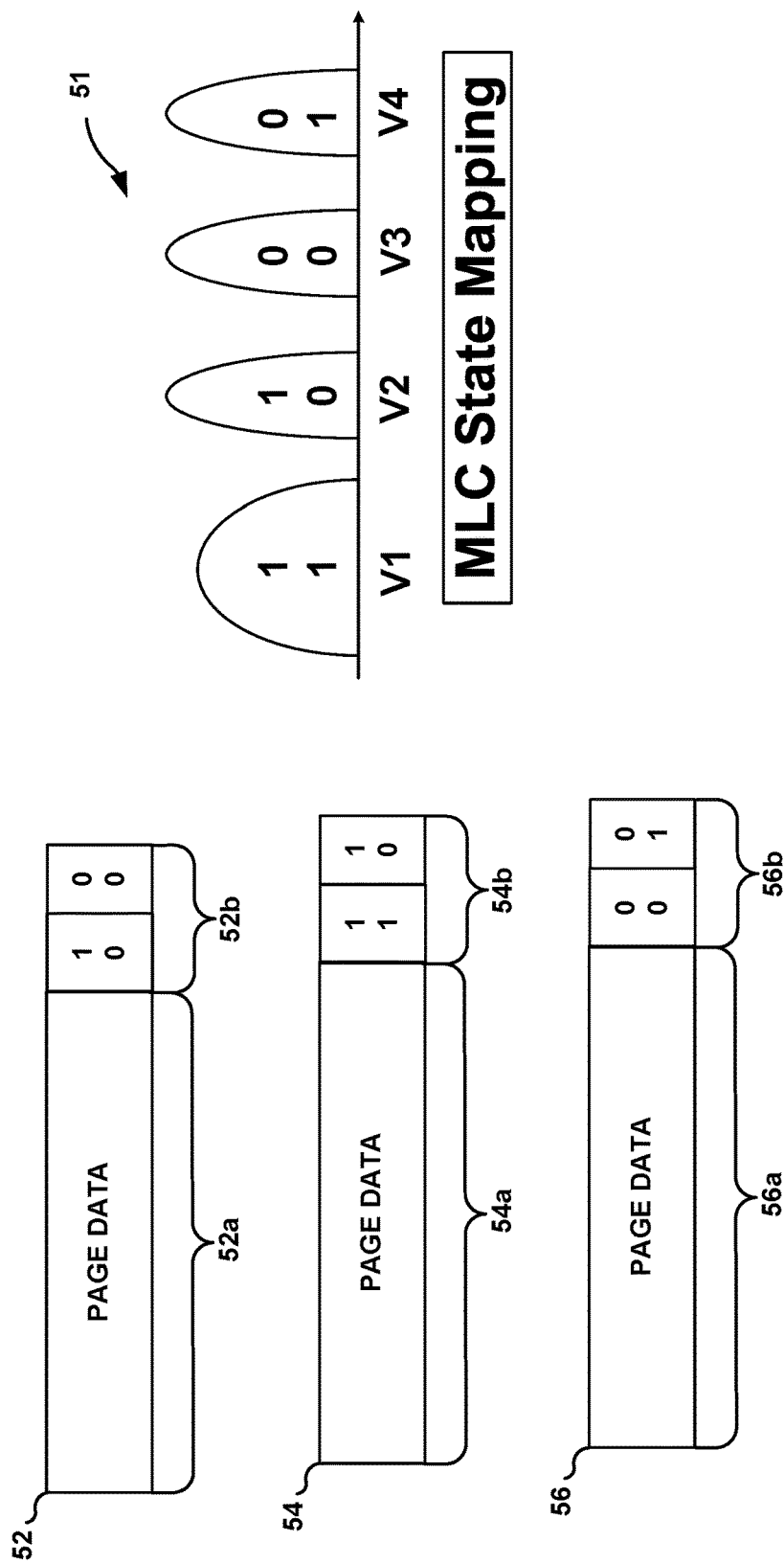
FIG. 3 is a conceptual diagram illustrating the dummy cell-based error identification scheme that controller 8 may implement in accordance with aspects of this disclosure.

FIG. 3 is a conceptual diagram illustrating the dummy cell-based error identification scheme that controller 8 may implement in accordance with aspects of this disclosure. Original page 52 includes page data portion 52a and dummy cell data 52b. For instance, controller 8 may populate dummy cell data 52b with predetermined patterns that controller 8 associates with error-free cells. In the particular example of FIG. 3, controller 8 may program two dummy cells with predetermined "10" and "00" patterns (V2 and V3 states) to indicate that no error has been detected with respect to original page 52. Thus, in some instances, original page 52 represents a page that is at a pre-error stage. Controller 8 may detect a read disturb error or a retention error with respect to original page 52, based on certain values read from dummy cell data 52b. For instance, particular values of dummy cell data 52b, which deviate from the predetermined error-free values, may indicate the specific error type that is detected with respect to original page 52. Conversely, if controller 8 detects that a page (e.g., original page 52) has dummy cell data that matches the predetermined "10" and "00" patterns, then controller 8 may determine that such a page is not presently subject to an error.

Legend 51 of FIG. 3 illustrates possible values that can be read from the dummy cells of a page. As shown, the predetermined error-free cells are programmed with "10" and "00" values, which correspond to the second and third voltage states in an ascending order of four voltage states. As such, a decrease in voltage with respect to original page 52 may cause the "10" value to be erroneously read as "11", and the "00" value to be erroneously read as "10." Similarly, an increase in voltage with respect to original page 52 may cause the "10" value to be erroneously read as "00", and the "00" value to be erroneously read as "01."

FIG. 3 also illustrates retention error page 54. In some instances, retention error page 54 represents an altered state of original page 52 due to a retention error. Because the retention error is associated with a drop in cell threshold voltage, dummy data 52b of original page 52b may shift to the left along the x-axis of legend 51. In other words, retention error page 54 may provide controller 8 with erroneous reads of dummy cell data compared to the originally programmed values.

Retention error page 54 includes the same page data, namely page data 52a, as the page data 54a for retention error page 54. More specifically, page data 54a of retention error page 54 is supposed to be identical to page data 52a of original page 52 (aside from any retention error or read disturbance errors in the page data 54a). However, controller 8 may read dummy cell data 54b of retention error page 54 to discern the retention mode error, based on erroneous values resulting from the charge leakage associated with the retention error. As shown in FIG. 3, retention error page 54 includes dummy cell data 54b, which is different from dummy cell data 52b of original page 52, because dummy cell data 54b provides erroneous values when read. More specifically, dummy cell data 54b includes a sequence of "11" and "10", which indicates a retention error, because the voltage drop associated with the retention error leads to reading of the dummy cell data 54b returning incorrect values. As described above, the voltage drop causes dummy cell data 52b to be corrupted according to a left-shift along the x-axis of legend 51, resulting in the sequence of "11" and "10" patterns being read.

Based on dummy cell data 54b now being read to provide the sequence of "11" and "10" patterns, controller 8 may use dummy cell data 54b to identify retention error page 54 as a page that has reached or is nearing its retention limit. Accordingly, controller 8 may implement the selective remediation techniques of this disclosure to reprogram the cells of retention error page 54 and restore the data stored by retention error page 54.

FIG. 3 also illustrates read disturbed page 56. In some instances, read disturbed page 56 represents an altered state of original page 52. For example, read disturbed page 56 may exhibit a read disturb error compared to original page 52 due to charge injection onto floating gates due to electron injection during reading other pages in the selected block. In turn, dummy data 52b of original page 52b is corrupted, thereby indicating the read disturb error when read by controller 8. More specifically, the charge injection along the word line may cause an increase in floating gate voltage, represented as a shift to the right along the x-axis of legend 51, thereby yielding a particular set of erroneous values.

Read disturbed page 56 from original page 52, may maintain the same page data, namely page data 52a, as page data 56a. More specifically, page data 56a of read disturbed page 56 is supposed to be identical to page data 52a of original page 52. However, controller 8 may read dummy cell data 56b of read disturbed page 56 to detect the read disturbance. As shown in FIG. 3, read disturbed page 56 includes dummy cell data 56b, which is different from dummy cell data 52b of original page 52, in that dummy cell data 56b provides erroneous values when read. More specifically, dummy cell data 56b includes a sequence of "00" and "01" patterns which indicate the read disturbance because of the voltage increase in the floating gates associated with the read disturbance. As described above, the voltage increase causes dummy cell data 52b to be corrupted due to the floating gate voltages being increased, represented by a right-shift along the x-axis of legend 51, resulting in the sequence of "00" and "01" patterns being read.

Based on dummy cell data 56b being populated with the sequence of "00" and "01" patterns, controller 8 may use dummy cell data 56b to identify read disturbed page 56 as a page that has gone through unwanted electron injection due to reading other cells on its word line. Accordingly, controller 8 may implement the selective remediation techniques of this disclosure to refresh the data from the cells of read disturbed page 56 to another page.

Figure 4:
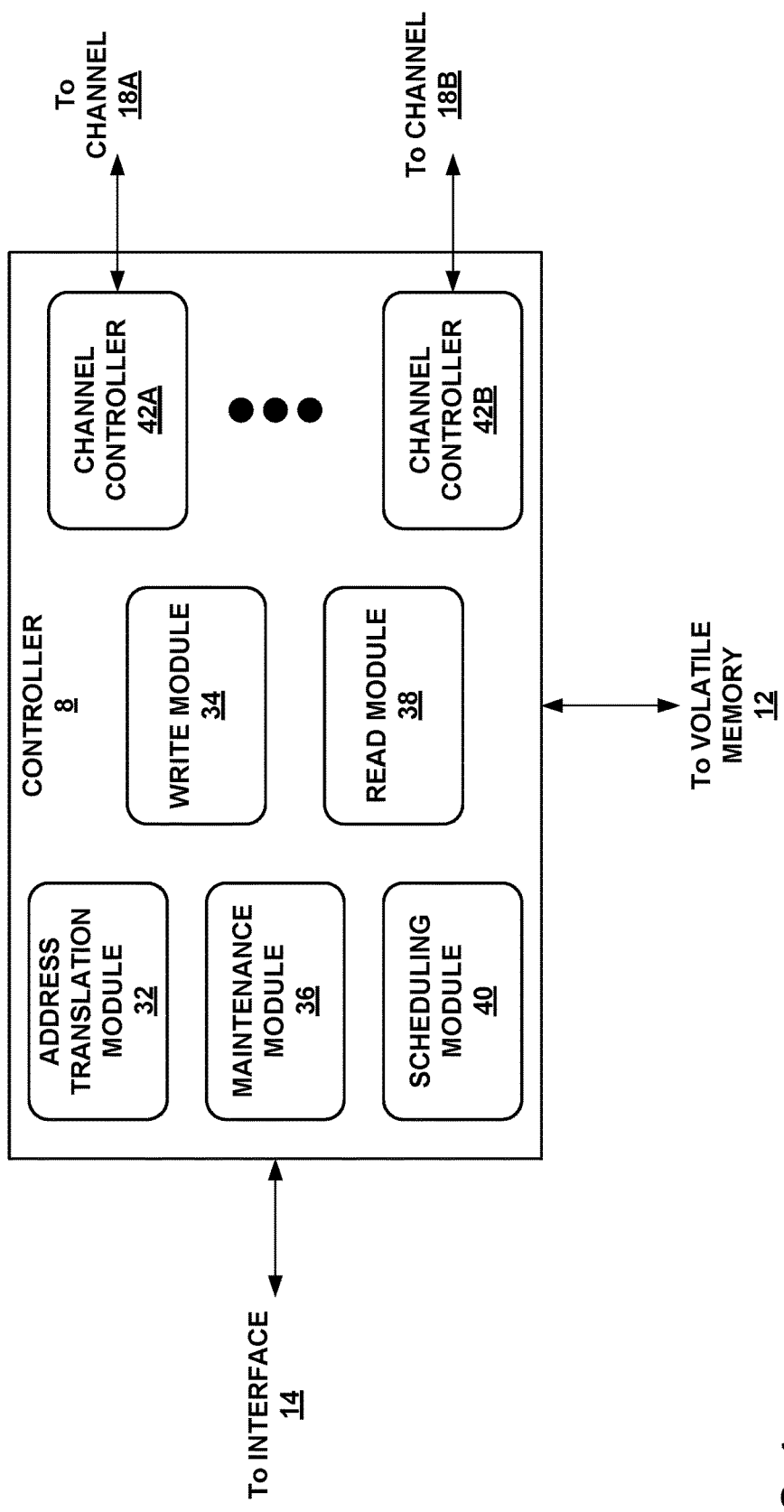
FIG. 4 is a conceptual and schematic block diagram illustrating an example controller, in accordance with one or more techniques of this disclosure.

FIG. 4 is a conceptual and schematic block diagram illustrating example details of controller 8. In some examples, controller 8 may include an address translation module 32, a write module 34, a maintenance module 36, a read module 38, a scheduling module 40, and a plurality of channel controllers 42A-42N (collectively, "channel controllers 53"). In other examples, controller 8 may include additional modules or hardware units, or may include fewer modules or hardware units. Controller 8 may include a microprocessor, digital signal processor (DSP), application specific integrated circuit (ASIC), field programmable gate array (FPGA), or other digital logic circuitry. In some examples, controller 8 may be a system on a chip (SoC).

Controller 8 may interface with the host device 4 via interface 14 and manage the storage of data to and the retrieval of data from memory devices 16. For example, write module 34 of controller 8 may manage writes to memory devices 16. For example, write module 34 may receive a message from host device 4 via interface 14 instructing storage device 6 to store data associated with a logical data address and the data. Write module 34 may manage writing of the data to memory devices 16.

For example, write module 34 may communicate with address translation module 32, which manages translation between logical data addresses used by host device 4 to manage storage locations of data and physical data addresses used by write module 34 to direct writing of data to memory devices 16. Address translation module 32 of controller 8 may utilize a logical to physical data address translation table that associates logical data addresses (or logical block addresses) of data stored by memory devices 16 to physical data addresses (or physical block addresses) of data stored by memory devices 16. For example, host device 4 may utilize the logical data addresses of the data stored by memory devices 16 in instructions or messages to storage device 6, while write module 34 utilizes physical data addresses of the data to control writing of data to memory devices 16. (Similarly, read module 38 may utilize physical data addresses to control reading of data from memory devices 16.) The physical data addresses correspond to actual, physical locations of memory devices 16.

As described above, in some examples, memory cells of memory devices 16 may be multiple-bit-per-cell memory cells, such as MLC flash memory cells, TLC flash memory cells, or the like. In some examples in which memory cells of memory devices 16 are multiple-bit-per-cell memory cells, multiple physical page addresses and multiple pages may be associated with a memory cell. For example, a first physical page address associated with an upper page and a second physical page address associated with a lower page may both be associated with a memory cell. The first physical page address and the second physical page address may be correlated in the logical to physical data address translation table. In some examples, address translation module 32 may store the logical to physical data address translation table in volatile memory 12.

In this way, host device 4 may be allowed to use a static logical data address for a certain set of data, while the physical data address at which the data is actually stored may change. Address translation module 32 may maintain the logical to physical data address translation table to map the logical data addresses to physical data addresses to allow use of the static logical data address by the host device 4 while the physical data address of the data may change, e.g., due to wear leveling, garbage collection, or the like. In some examples, the logical to physical data address translation table may be a single layer table, such that by applying a hash to a logical data address received from host device 4, address translation module 32 may directly retrieve a corresponding physical data address.

As discussed above, write module 34 of controller 8 may perform one or more operations to manage the writing of data to memory devices 16. For example, write module 34 may manage the writing of data to memory devices 16 by selecting one or more blocks within memory devices 16 to store the data and causing memory devices of memory devices 16 that include the selected blocks to actually store the data. As discussed above, write module 34 may cause address translation module 32 to update the logical to physical data address translation table based on the selected blocks. For instance, write module 34 may receive a message from host device 4 that includes a unit of data and a logical data address, select a block and page within a particular memory device of memory devices 16 to store the data, cause the particular memory device of memory devices 16 to actually store the data (e.g., via a channel controller of channel controllers 42 that corresponds to the particular memory device), and cause address translation module 32 to update the logical to physical data address translation table to indicate that the logical data address corresponds to the selected physical data address within the particular memory device of memory devices 16.

In some examples, in addition to causing the data to be stored by memory devices 16, write module 34 may cause memory devices 16 to store information which may be used to recover the unit of data should one or more of the blocks fail or become corrupted. The parity information may be used to recover the data stored by other blocks. In some examples, the parity information may be an XOR of the data stored by the other blocks.

In order to write a bit with a logical value of 0 (charged) to a bit with a previous logical value of 1 (uncharged), a large current is used. This current may be sufficiently large that it may cause inadvertent changes to the charge of adjacent flash memory cells. To protect against inadvertent changes, an entire block of flash memory cells may be erased to a logical value of 1 (uncharged) prior to writing any data to cells within the block. Because of this, flash memory cells may be erased at the block level and written at the page level.

Responsive to receiving a write command from host device 4, write module 34 may determine at which physical locations (e.g., blocks) of memory devices 16 to write the data. For example, write module 34 may request from address translation module 22 or maintenance module 36 one or more physical block addresses that are empty (e.g., store no data), partially empty (e.g., only some pages of the block store data), or store at least some invalid (or stale) data. Upon receiving the one or more physical block addresses, write module 34 may select one or more block as discussed above, and communicate a message that causes channel controllers 42 to write the data to the selected blocks.

Read module 38 similarly may control reading of data from memory devices 16. For example, read module 38 may receive a message from host device 4 requesting data with an associated logical data address. Address translation module 32 may convert the logical data address to a physical data address using the flash translation layer or table. Read module 38 then may control one or more of channel controllers 42 to retrieve the data from the physical data addresses. Similar to write module 34, read module 38 may select one or more blocks and communicate a message to that causes channel controllers 42 to read the data from the selected blocks.

Each channel controller of channel controllers 42 may be connected to a respective channel of channels 18. In some examples, controller 8 may include the same number of channel controllers 42 as the number of channels 18 of storage device 2. Channel controllers 42 may perform the intimate control of addressing, programming, erasing, and reading of memory devices 16 connected to respective channels, e.g., under control of write module 34, read module 38, and/or maintenance module 36.

Maintenance module 36 may be configured to perform operations related to maintaining performance and extending the useful life of storage device 6 (e.g., memory devices 16). For example, maintenance module 36 may implement at least one of wear leveling or garbage collection.

Scheduling module 40 of controller 8 may schedule operations to be performed by memory devices 16. For instance, scheduling module 40 may cause one or more of memory devices 16 to perform one or more operations based on requests received from other components of controller 8. In some examples, scheduling module 40 may cause a particular memory device of memory devices 16 to perform one or more operations by causing a channel controller corresponding to the particular memory device to output commands to the particular memory device. As one example, scheduling module 40 may permit channel controller 42A to output commands that cause memory device 16Aa to store data.

Figure 5:
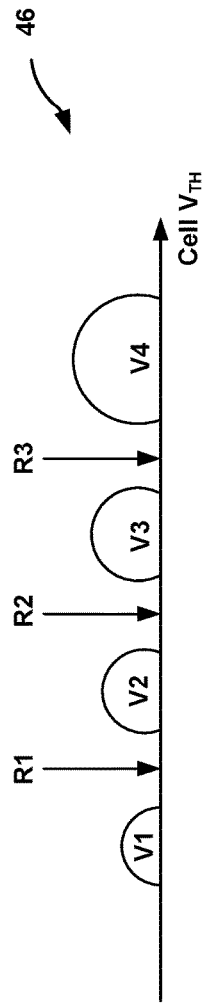
FIGS. 5-7 are conceptual diagrams illustrating cell threshold voltage distributions associated with correct and error-affected read voltages.

In accordance with one or more techniques of this disclosure, maintenance module 36 may implement one or more of the selective remediation techniques described above, to correct read disturbance errors and retention errors using techniques suited to the nature of each error. As discussed above, maintenance module 36 may reprogram pages that are at or near their retention limits, and may refresh pages that exhibit a read disturbance error. Both retention errors and read disturbance errors are manifested as errors with respect to the cell voltage levels. For instance, the electron depletion associated with a retention error or the electron injection associate a read disturbance error may cause overlaps in the possible cell voltages for a cell and the reference read voltages that maintenance module 36 uses to distinguish between the possible cell voltages. FIG. 5 is a conceptual diagram illustrating a correct distribution 46 that shows potential cell voltages for a cell. A single cell may be programmed by injecting charge into the floating gate of the cell to result in one of the voltage states V1-V4 being the cell threshold voltage. Each of voltages V1-V4 may correspond to one of the values illustrated in legend 51 of FIG. 3. For instance, voltage V1 may represent a pattern of "11," voltage V2 may represent a pattern of "10," voltage V3 may represent a pattern of "00," and voltage V4 may represent a pattern of "01." Read module 38 may cause one or more of channel controllers 42 to distinguish between the possible voltages of the v$^{th}$ cell to read data from the cells by applying read reference voltages R1-R3 that fall between two "adjacent" possible cell voltages of V1-V4. As shown in the example shown in FIG. 5, read module 38 may use the first read reference voltage R1 to distinguish voltage V1 from the remaining voltages V2-V4 for the cell. Similarly, read module 38 may use the second read reference voltage R2 to distinguish between a {V1, V2} selection and a {V3, V4} selection. In other words, read module 38 may use the second reference read voltage to distinguish between a cell with a voltage of V1 or V2 and a cell with a voltage of V3 or V4. Read module 38 may use the third reference read voltage R3 to distinguish between voltage V4 and the remaining voltages V1-V3.

Because the reference read voltages R1-R3 fall between the respective pairs of the cell voltages V1-V4 of the cell in FIG. 5, the reference read voltages, when applied, would elicit a correct read of one the content of the data cell (illustrated in legend 51 of FIG. 3) from the cell, according to correct distribution 46. However, if the voltages on the floating gates of the cells are altered due to a read disturbance or a retention error, then the application of one or more of the reference read voltages R1-R3 may possibly cause an erroneous read of one of the "11," "10," "00," or "01" patterns from the V$^{th}$ cell. As an example, charge injection leading to read disturbance errors may cause the cell voltage to increase, thereby potentially overlapping with a reference read reference voltage that is normally greater than the cell voltage.

Figure 6:
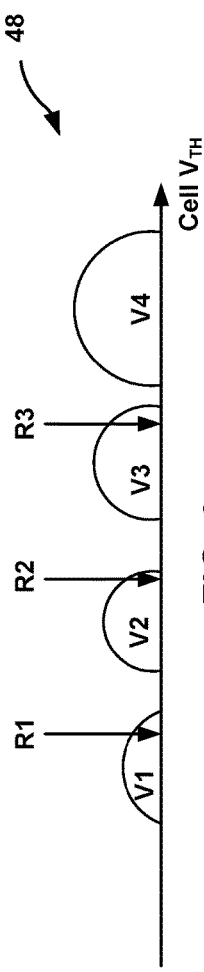

An example of read disturbances caused by charge injection along the word line of the V$^{th}$ cell is illustrated in read disturbed distribution 48 of the conceptual diagram of FIG. 6. In the example of read disturbed distribution 48, incidental or unintended charge injection along the word line of the V$^{th}$ cell causes cell voltage to increase, regardless of whether the cell voltage is V1, V2, V3, or V4. Although not drawn to scale, read disturbed distribution 48 of FIG. 6 the rightward shift expansion of the cell voltages along the horizontal axis represents increases in the cell voltage of the V$^{th}$ cell (one of V1-V4). Due to rightward expansions of the cell voltage, each of reference read voltages R1-R3 now falls within the range of one of potential cell voltages V1-V3. More specifically, each of reference read voltages now coincides with the one of the potential cell voltages V1-V3 that was originally to its left in correct distribution 46 of FIG. 5. Because the charge injection along the word line causes each of the potential cell voltages V1-V3 to increase (shown as a rightward expansion along the horizontal axis in FIG. 6), each of potential cell voltages V1-V3 now overlaps with a respective one of reference read voltages R1-R3. Thus, once the V$^{th}$ cell experiences a read disturbance error, controller 8 (e.g., read module 38 or maintenance module 36) may not be able to accurately distinguish between a cell having a voltage of V1 or V2 when applying read reference voltage R1, between a cell having a voltage of V2 or V3 when applying read reference voltage R2, or between a cell having a voltage of V3 or V4 when applying read reference voltage R3. Thus, the controller 8 (e.g., read module 38 or maintenance module 36) may not accurately recover data from the cell, and may instead return erroneous data.

Figure 7:
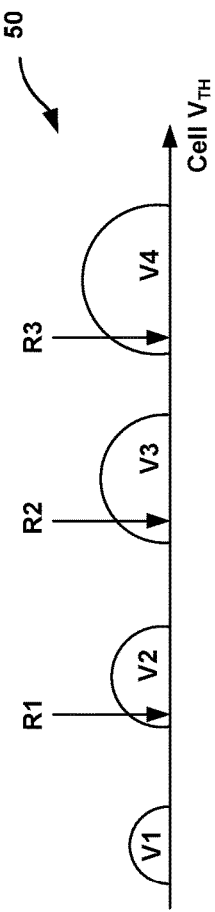

FIG. 7 is a conceptual diagram illustrating an example of retention errors caused by electron leakage from the V$^{th}$ cell, shown by way of retention error distribution 50. The scenario depicted in FIG. 7 represents an instance of a retention error occurring in the V$^{th}$ cell, due to electron leakage from the floating gate of the V$^{th}$ cell. Although not drawn to scale, retention error distribution 50 of FIG. 7 illustrates a leftward shift or expansion of the potential cell voltages V1-V4 along the horizontal axis, to represent a decrease in the potential cell voltages. Due to the leftward expansions of the potential cell voltages, each of reference read voltages R1-R3 now coincides with one of cell voltages V2-V4. More specifically, each of reference read voltages now coincides with, or falls within the range of, the one of the potential cell voltages V2-V4 that was originally to its right in FIG. 7. Because the electron leakage causes each of the potential cell voltages V2-V4 to decrease (shown as a leftward expansion along the horizontal axis in retention error distribution 50 of FIG. 7), each of the potential cell voltages V2-V4 now overlaps with a respective one of reference read voltages R1-R3, thus causing an erroneous return of the pattern of one of cell voltages V2-V4 when read module 38 applies one of reference read voltages R1-R3.

By way of the selective remediation techniques of this disclosure, controller 8 or certain components thereof, such as maintenance module 36, may implement different mechanisms to restore the erroneous distributions of FIGS. 6 and 7 to the correct distribution 46 of FIG. 5. For instance, based on detecting that read disturbed distribution 48 indicates one or more read disturbances along the series of cells, maintenance module 46 may opt to initiate a refresh operation with respect to the cell(s) that display a read disturbance error. In contrast, based on detecting that retention error distribution 70 indicates one or more retention errors along the series of cells, maintenance module 46 may opt to initiate a reprogramming operation with respect to the cell(s) that display a retention error, or are nearing their respective retention limits.

Figure 8:
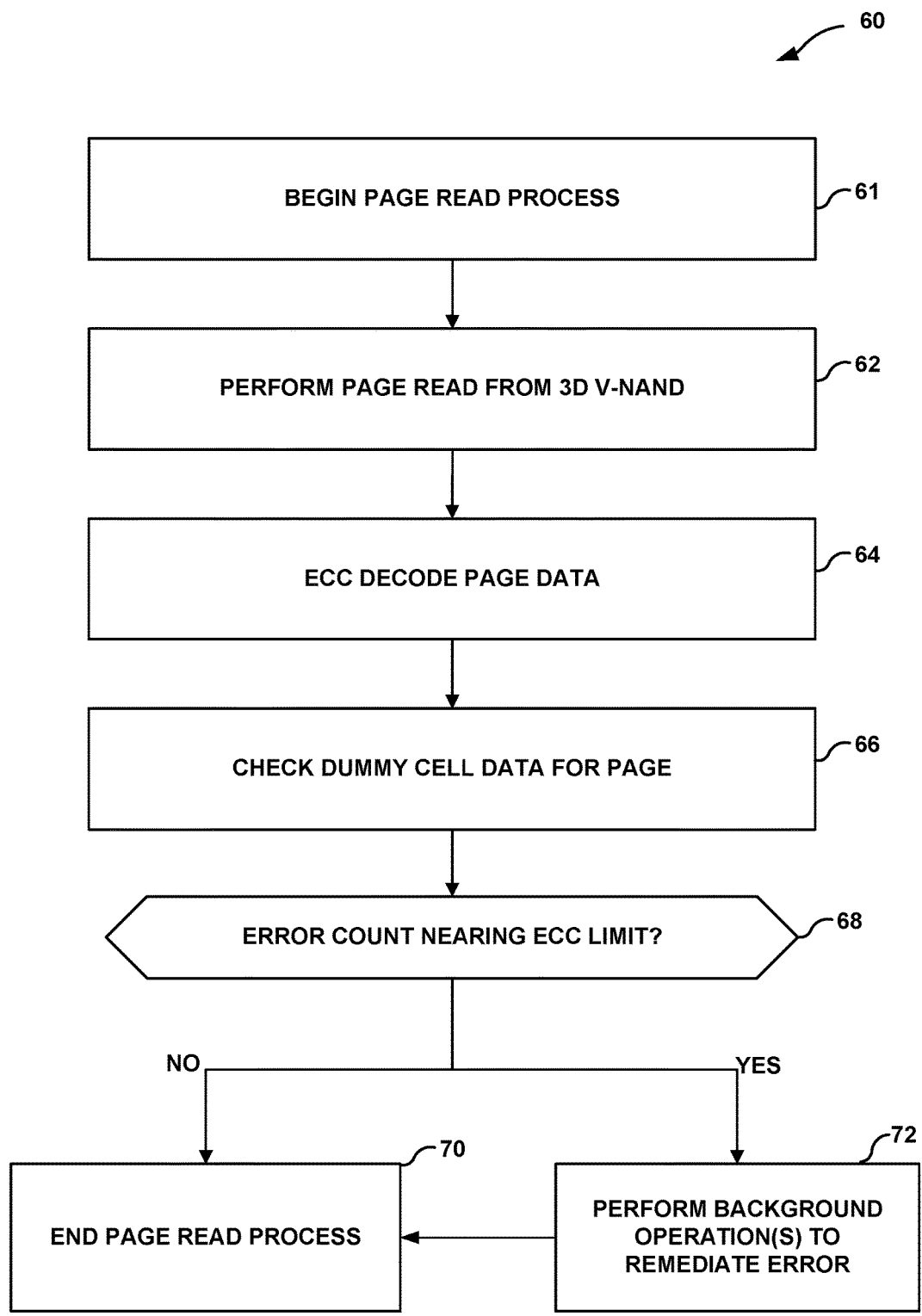
FIG. 8 is a flow diagram illustrating an example process 60 by which controller 8, and/or components thereof, may implement to detect and remediate errors, in accordance with the aspects of this disclosure.

FIG. 8 is a flow diagram illustrating an example process 60 by which controller 8, and/or components thereof, may implement to detect and remediate errors, in accordance with the aspects of this disclosure. While process 60 of FIG. 8 is described herein with respect to controller 8, it will be understood that process 60 may be performed by a variety of devices and/or components thereof. Process 60 may begin when controller 8 begins a page read process (61). For instance, the page read process may be applicable to various memory devices 16 of non-volatile memory array 10 illustrated in FIG. 1. In turn, controller 8 may perform a page read from 3D NAND cells of non-volatile memory array 10 (62). For instance, read module 38 of controller 8 may implement a read algorithm that is compatible with 3D NAND technology to read one or more of the pages from the 3D NAND cells of non-volatile memory array 10.

In turn, controller 8 may decode the read page data using an error correction code (ECC) (64). As an example, controller 8 may decode the read page data in order to analyze the decoded data to make one or more further determinations. In turn, controller 8 may check the dummy cell data for the page that was read (66). As described above with respect to FIG. 3, controller 8 may implement techniques of this disclosure to use the dummy cell data to determine whether the page has exhibited an error. For instance, controller 8 may identify a retention error (or a nearing of a retention limit) based on a particular deviation from the predetermined set of dummy cell values, and may recognize a read disturbance error based on another deviation from the predetermined set of dummy cell values.

Controller 8 may determine whether an error count is nearing an ECC limit (decision block 68). If controller 8 determines that the error count is not nearing the ECC limit (NO branch of decision block 68), then controller 8 may end or conclude the page read process (70). However, if controller 8 determines that the error count is nearing the ECC limit (YES branch of decision block 68), then controller 8 and/or components thereof may perform one or more background operations to remediate the detected errors (72). For instance, maintenance module 36 of controller 8 may perform the selective remediation techniques of this disclosure.

Figure 9:
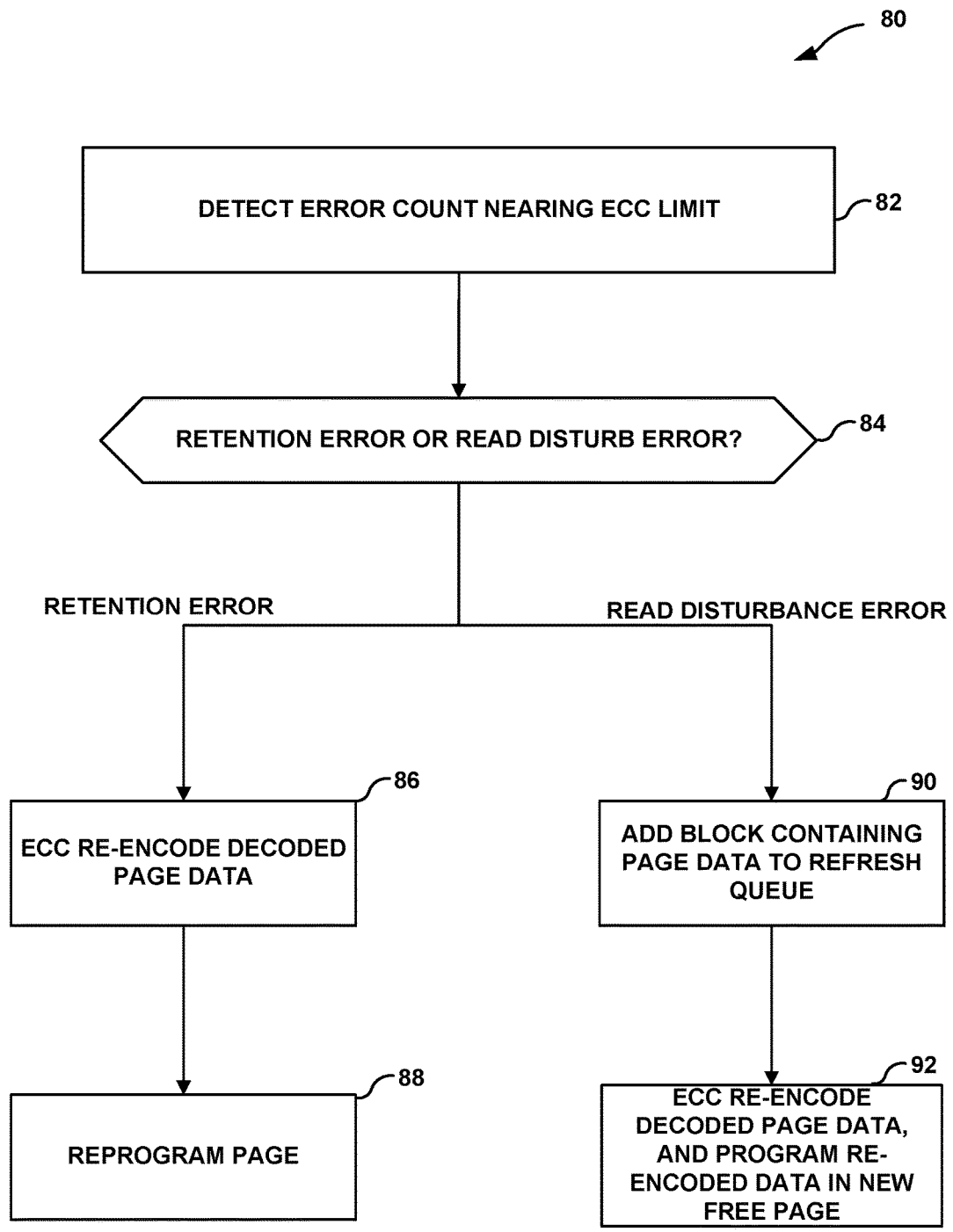
FIG. 9 is a flowchart illustrating an example process that a controller and/or components thereof may perform to implement selective remediation based on the nature of a particular error, in accordance with aspects of this disclosure.

FIG. 9 is a flowchart illustrating an example process 80 that controller 8 and/or components thereof may perform to implement selective remediation based on the nature of a particular error in accordance with aspects of this disclosure. Process 80 may begin when maintenance module 36 of controller 8 detects that an error count is nearing the ECC limit (82).

The remaining portions of process 80 of FIG. 9 represent one non-limiting example of the background operations denoted by step 72 of process 60 of FIG. 8. In response to detecting that the error count is nearing the ECC limit, maintenance module 36 may determine whether an error-affected page exhibits a retention error or the error-affected page exhibits a read disturb error (decision block 84). As an example, maintenance module 36 may determine which deviation from the predetermined dummy cell data is reflected in the presently-read dummy cell data of the error-affected page. If maintenance module 36 determines that the page is affected by a retention error (left branch of decision block 84), then maintenance module 36 may re-encode the decoded data that was read from the affected page using an ECC (86). In turn, maintenance module 36 may reprogram the affected page (88). For instance, maintenance module 36 may reprogram the page in-place, as discussed above. According to the in-place reprogramming techniques described herein, maintenance module 36 may restore the ECC re-encoded page data to the now-reprogrammed page.

If maintenance module 36 detects that the affected page exhibits a read disturbance error (right branch of decision block 84), then maintenance module 36 may add an entire block that includes the affected page to refresh queue (90). Maintenance module 36 may ECC re-encode the decoded page data, and program the re-encoded data in a new free page before any erase operations from the head block in the refresh queue (92).

By batch-processing the entire block, maintenance module 36 may implement the techniques of this disclosure to conserve time and resources in erase operations, as multiple read disturbance error pages can be found in a same block simultaneously. For instance, targeting a single page may be a relatively time-consuming and resource-heavy way to erase the affected page, in comparison to erasing the entire block that includes the affected page.

As illustrated in the conceptual diagram of FIG. 10, maintenance module 36 may add erased block 102 to a tail of refresh queue 104. Slots of refresh queue 104 that are shaded using diagonal lines represent slots that are already allotted to error-prone blocks. slots of refresh queue 104 that are not shaded represent slots that are open to be filled by a new block. Maintenance module 36 may apply refresh operations to the block of refresh queue 104 on a block-by-block basis, beginning at the leftmost filled slot (i.e. head), and progressing to the right in single-block increments. As such, FIG. 10 illustrates the placement of erased block 102 in the leftmost unfilled slot of refresh queue 104. Maintenance module 36 may maintain refresh queue 104 using a trigger threshold that maintenance module 36 determines based on a tolerance associated with ECC capability.

Although the foregoing examples have been described with respect to a controller (and/or components thereof) of a storage device, in other examples, the examples described herein may be implemented by another processor, such as a general purpose processor, or a read channel. Further, although the examples have been described with respect to flash memory, the techniques described herein may be utilized with other types of multi-level memory cells. For example, the techniques described herein may be utilized with resistive RAM, phase-change memory, magnetoresistive RAM, DRAM, or the like.

The techniques described in this disclosure may be implemented, at least in part, in hardware, software, firmware, or any combination thereof. For example, various aspects of the described techniques may be implemented within one or more processors, including one or more microprocessors, DSPs, ASICs, FPGAs, or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. A control unit including hardware may also perform one or more of the techniques of this disclosure.

Such hardware, software, and firmware may be implemented within the same device or within separate devices to support the various techniques described in this disclosure. In addition, any of the described units, modules or components may be implemented together or separately as discrete but interoperable logic devices. Depiction of different features as modules or units is intended to highlight different functional aspects and does not necessarily imply that such modules or units must be realized by separate hardware, firmware, or software components. Rather, functionality associated with one or more modules or units may be performed by separate hardware, firmware, or software components, or integrated within common or separate hardware, firmware, or software components.

The techniques described in this disclosure may also be embodied or encoded in an article of manufacture including a computer-readable storage medium encoded with instructions. Instructions embedded or encoded in an article of manufacture including a computer-readable storage medium encoded, may cause one or more programmable processors, or other processors, to implement one or more of the techniques described herein, such as when instructions included or encoded in the computer-readable storage medium are executed by the one or more processors. Computer readable storage media may include random access memory (RAM), read only memory (ROM), programmable read only memory (PROM), erasable programmable read only memory (EPROM), electronically erasable programmable read only memory (EEPROM), flash memory, a hard disk, a compact disc ROM (CD-ROM), a floppy disk, a cassette, magnetic media, optical media, or other computer readable media. In some examples, an article of manufacture may include one or more computer-readable storage media.

In some examples, a computer-readable storage medium may include a non-transitory medium. The term "non-transitory" may indicate that the storage medium is not embodied in a carrier wave or a propagated signal. In certain examples, a non-transitory storage medium may store data that can, over time, change (e.g., in RAM or cache).

Various examples have been described. These and other examples are within the scope of the following claims.

What is claimed is:

1. A method comprising:
reading, by one or more processors, dummy cell data stored at one or more dummy cells associated with a first page of NAND flash memory;
detecting, by the one or more processors, an error condition associated with the first page of the NAND flash memory based on the dummy cell data;
determining, by the one or more processors, whether the error condition is associated with a read disturbance or with a retention error based on the dummy cell data;
if the error condition is associated with the read disturbance, initiating, by the one or more processors, a refresh operation with respect to the first page to write data stored at the first page to a second page of the NAND flash memory; and
if the error condition is associated with the retention error, initiating, by the one or more processors, a reprogramming operation with respect to the first page to rewrite the data stored at the first page to the first page.

2. The method of claim 1, wherein the error condition is associated with the retention error, the method further comprising:
reading the data that is stored at the first page;
decoding the data that is read from the first page;
encoding the decoded data; and
writing the encoded data to the first page.

3. The method of claim 2, wherein:
decoding the data read from the first page comprises decoding the data using a first error correction code (ECC), and
encoding the decoded data comprises encoding the decoded data using a second error correction code (ECC).

4. The method of claim 1, wherein the error condition is associated with the read disturbance, and wherein the first page is a read disturbed page, the method further comprising:
placing, by the one or more processors, a block of pages in a refresh queue monitored by the one or more processors, based on a determination that the block of pages includes the read disturbed page;
reading, by the one or more processors, the block of pages that includes the read disturbed page;
decoding the data that is read from the first page;
encoding the decoded data;
writing the encoded data to the second page; and
erase the data stored at the first page.

5. The method of claim 4, further comprising:
decoding, by the one or more processors, data that is stored in the block of pages; and
encoding, by the one or more processors, the decoded data to form a block of encoded data.

6. The method of claim 4, wherein placing the block of pages in the refresh queue comprises placing the block of pages at a tail of the refresh queue, the method further comprising:
refreshing a block positioned at a head of the refresh queue prior to refreshing any other block included in the refresh queue.

7. The method of claim 6, further comprising:
in response to a number of blocks in the refresh queue being greater than or equal to a threshold number of blocks, refreshing the block positioned at the head of the refresh queue.

8. The method of claim 1, wherein determining whether the error condition is associated with the read disturbance or with the retention error comprises:
in response to the dummy cell data read from the first page matching a first pattern, determining that the error condition is associated with the read disturbance; and
in response to the dummy cell data read from the first page matching a second pattern, determining that the error condition is associated with the retention error.

9. The method of claim 1, wherein the one or more dummy cells associated with the first page of the NAND flash memory include a first dummy cell of the first page and a second dummy cell of the first page, the first dummy cell programmed according to a first voltage range, the second dummy cell programmed according to a second voltage range adjacent to the first voltage range.

10. A device comprising:
a memory device comprising NAND flash memory; and
one or more processors configured to:
read dummy cell data stored at one or more dummy cells associated with a first page of the NAND flash memory;
detect an error condition associated with the first page of the NAND flash memory based on the dummy cell data;
determine whether the error condition is associated with a read disturbance or with a retention error based on the dummy cell data;
if the error condition is associated with the read disturbance, initiate a refresh operation with respect to the first page to write data stored at the first page to a second page of the NAND flash memory; and
if the error condition is associated with the retention error, initiate a reprogramming operation with respect to the first page to rewrite the data stored at the first page to the first page of the NAND flash memory.

11. The device of claim 10, wherein the error condition is associated with the retention error, and wherein the one or more processors are further configured to:
read the data that is stored at the first page;
decode the data that is read from the first page;
encode the decoded data; and
write the encoded data to the first page.

12. The device of claim 11, wherein:
to decode the data read from the first page, the one or more processors are configured to decode the data using a first error correction code (ECC), and
to encode the decoded data, the one or more processors are configured to encode the decoded data using a second error correction code (ECC).

13. The device of claim 10, wherein the error condition is associated with the read disturbance, wherein the first page is a read disturbed page, and wherein the one or more processors are further configured to:
place a block of pages in a refresh queue monitored by the one or more processors, based on a determination that the block of pages includes the read disturbed page;
read the block of pages that includes the read disturbed page;
decode the data that is read from the first page;
encode the decoded data;
write the encoded data to the second page; and
erase the block.

14. The device of claim 13, wherein the one or more processors are further configured to:
  decode data that is stored in the block of pages; and
  encode the decoded data to form a block of encoded data.

15. The device of claim 13,
  wherein to place the block of pages in the refresh queue, the one or more processors are configured to place the block of pages at a tail of the refresh queue, and
  wherein the one or more processors are configured to refresh a block positioned at a head of the refresh queue prior to refreshing any other block included in the refresh queue.

16. The device of claim 15, wherein the one or more processors are configured to refresh, in response to a number of blocks in the refresh queue being greater than or equal to a threshold number of blocks, the block positioned at the head of the refresh queue.

17. The device of claim 10, wherein to determine whether the error condition is associated with the read disturbance or with the retention error, the one or more processors are configured to:
  determine, in response to the dummy cell data read from the first page matching a first erroneous pattern, that the error condition is associated with the read disturbance; and
  determine, in response to the dummy cell data read from the first page matching a second erroneous pattern, that the error condition is associated with the retention error.

18. A non-transitory computer-readable storage medium encoded with instructions that, when executed, cause one or more processors of a computing device to:
  read dummy cell data stored at one or more dummy cells associated with a first page of NAND flash memory;
  detect an error condition associated with the first page of the NAND flash memory based on the dummy cell data;
  determine whether the error condition is associated with a read disturbance or with a retention error;
  if the error condition is associated with the read disturbance, initiate a refresh operation with respect to the first page to write data stored at the first page to a second page; and
  if the error condition is associated with the retention error, initiate a reprograming operation with respect to the first page to rewrite the data stored at the first page to the first page.

19. The non-transitory computer-readable storage medium of claim 18, wherein the error condition is associated with the read disturbance, and wherein the first page is a read disturbed page, the non-transitory computer-readable storage medium being further encoded with instructions that, when executed, cause the one or more processors of the computing device to:
  place a block of pages in a refresh queue monitored by the one or more processors, based on a determination that the block of pages includes the read disturbed page;
  in response to a number of blocks in the refresh queue being greater than or equal to a threshold number of blocks, refresh the block positioned at a head of the refresh queue:
  read a block of pages that includes the read disturbed page;
  decode data stored in the block of pages;
  encode the decoded data to form a block of encoded data;
  write the encoded data to the second page; and
  erase the block of pages.

20. The non-transitory computer-readable storage medium of claim 18, wherein the error condition is associated with the retention error, the non-transitory computer-readable storage medium being further encoded with instructions that, when executed, cause the one or more processors of the computing device to:
  read the data that is stored at the first page;
  decode, using a first error correction code (ECC), the data that is read from the first page;
  encode, using a second ECC, the decoded data; and
  write the encoded data to the first page.

* * * * *